United States Patent
Park et al.

(10) Patent No.: US 10,403,603 B2
(45) Date of Patent: Sep. 3, 2019

(54) SEMICONDUCTOR PACKAGE AND FABRICATION METHOD THEREOF

(71) Applicant: SAMSUNG ELECTRONICS CO., LTD., Suwon-si (KR)

(72) Inventors: Seung Won Park, Suwon-si (KR); Yeong Kwon Ko, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/657,759

(22) Filed: Jul. 24, 2017

(65) Prior Publication Data

US 2018/0166420 A1 Jun. 14, 2018

(30) Foreign Application Priority Data

Dec. 13, 2016 (KR) .................. 10-2016-0169456

(51) Int. Cl.
| | |
|---|---|
| H01L 23/00 | (2006.01) |
| H01L 23/31 | (2006.01) |
| H01L 23/46 | (2006.01) |
| H01L 29/06 | (2006.01) |
| H01L 23/473 | (2006.01) |
| H01L 25/065 | (2006.01) |

(52) U.S. Cl.
CPC .......... *H01L 25/0657* (2013.01); *H01L 23/31* (2013.01); *H01L 23/3157* (2013.01); *H01L 23/46* (2013.01); *H01L 29/06* (2013.01); *H01L 23/3121* (2013.01); *H01L 23/3128* (2013.01); *H01L 23/473* (2013.01); *H01L 24/94* (2013.01); *H01L 25/0652* (2013.01); *H01L 2225/06541* (2013.01); *H01L 2225/06589* (2013.01)

(58) Field of Classification Search
CPC ............... H01L 25/065; H01L 25/0652; H01L 25/0657; H01L 29/00; H01L 25/073
See application file for complete search history.

(56) References Cited

U.S. PATENT DOCUMENTS

| | | | |
|---|---|---|---|
| 7,116,002 B2 | 10/2006 | Chao et al. | |
| 7,675,153 B2 | 3/2010 | Kurosawa et al. | |
| 7,683,459 B2 | 3/2010 | Ma et al. | |
| 7,691,726 B2 | 4/2010 | Seng | |
| 9,040,361 B2 | 5/2015 | Chang et al. | |
| 2002/0047210 A1* | 4/2002 | Yamada | H01L 21/76898 257/774 |
| 2002/0096754 A1 | 7/2002 | Chen et al. | |
| 2013/0157414 A1 | 6/2013 | Ho et al. | |
| 2014/0048930 A1* | 2/2014 | Choi | H01L 24/13 257/737 |

* cited by examiner

*Primary Examiner* — Moazzam Hossain
*Assistant Examiner* — Stanetta D Isaac
(74) *Attorney, Agent, or Firm* — Sughrue Mion, PLLC

(57) ABSTRACT

A semiconductor package includes a semiconductor chip in which a side step or a side slope formed toward an inactive surface from an active surface is included and a width of the active surface is smaller than a width of the inactive surface, and an underfill which is disposed on the active surface and positioned at an inner side of the edge of the semiconductor chip.

19 Claims, 13 Drawing Sheets

SEMICONDUCTOR PACKAGE AND FABRICATION METHOD THEREOF

CROSS-REFERENCE TO RELATED APPLICATION

This application claims priority from Korean Patent Application No. 10-2016-0169456 filed in the Korean Intellectual Property Office on Dec. 13, 2016, the entire contents of which are incorporated herein by reference.

BACKGROUND OF THE INVENTION

Field of the Invention

Apparatuses and methods consistent with the present disclosure relate to a semiconductor package and a fabrication method thereof.

Description of the Related Art

In order to satisfy performance and cost required by consumers, integration of a semiconductor memory device needs to be increased. In the case of a two-dimensional (2D) or planar semiconductor memory device, the integration is mainly determined by an area occupied by a unit memory cell to be largely influenced by a level of a technique of forming minute patterns.

For fineness of the patterns, since expensive equipment is required, integration of the 2D semiconductor memory device is limited. In order to overcome the limitation, a three-dimensional (3D) semiconductor package including three-dimensionally arranged semiconductor chips has been proposed. Accordingly, in addition to higher integration of the semiconductor package, a technology capable of improving reliability and a process margin of the semiconductor package has been required.

SUMMARY

Example embodiments provide a semiconductor package capable of improving a warpage phenomenon and a process margin and a fabrication method thereof.

According to an aspect of an example embodiment, there is provided a semiconductor package including: a substrate; at least one semiconductor chip disposed on the substrate and including an active surface and an inactive surface, wherein a side step or a side slope is formed from the active surface to the inactive surface and a first width of the active surface is smaller than a second width of the inactive surface; and at least one underfill which is interposed between the substrate the active surface of the at least one semiconductor chip and positioned at an inner side of an edge of the at least one semiconductor chip.

According to an aspect of another example embodiment, there is provided a semiconductor package including: a substrate; a stacked package disposed on the substrate and including a logic chip and a plurality of memory chips stacked on the logic chip; at least one semiconductor chip or a stacked wafer level package which is flip-chip-bonded on the substrate, wherein each of the plurality of memory chips includes an active surface and an inactive surface, a side step or a side slope is formed from the active surface to the inactive surface, and a first width of the active surface is smaller than a second width of the inactive surface; and an underfill which is disposed on the active surface of each of the plurality of memory chips and positioned at an inner side of an edge of each of the plurality of memory chips.

According to an aspect of another example embodiment, there is provided semiconductor package including: a substrate; at least one semiconductor chip including an inactive surface, an active surface, and a side surface between the inactive surface and the active surface, the side surface including a stepped portion or a sloped portion extending from an edge of the active surface; and an underfill which is provided between the substrate the active surface of the at least one semiconductor chip.

According to the example embodiments, the semiconductor package can improve a warpage phenomenon.

Further, the semiconductor package can improve defects due to overflow of the adhesive.

BRIEF DESCRIPTION OF THE DRAWINGS

The above and/or other aspects will become apparent and more readily appreciated from the following description of example embodiments, taken in conjunction with the accompanying drawings in which.

DETAILED DESCRIPTION

Hereinafter, semiconductor packages and fabrication methods thereof according to example embodiments will be described.

Figure 1:
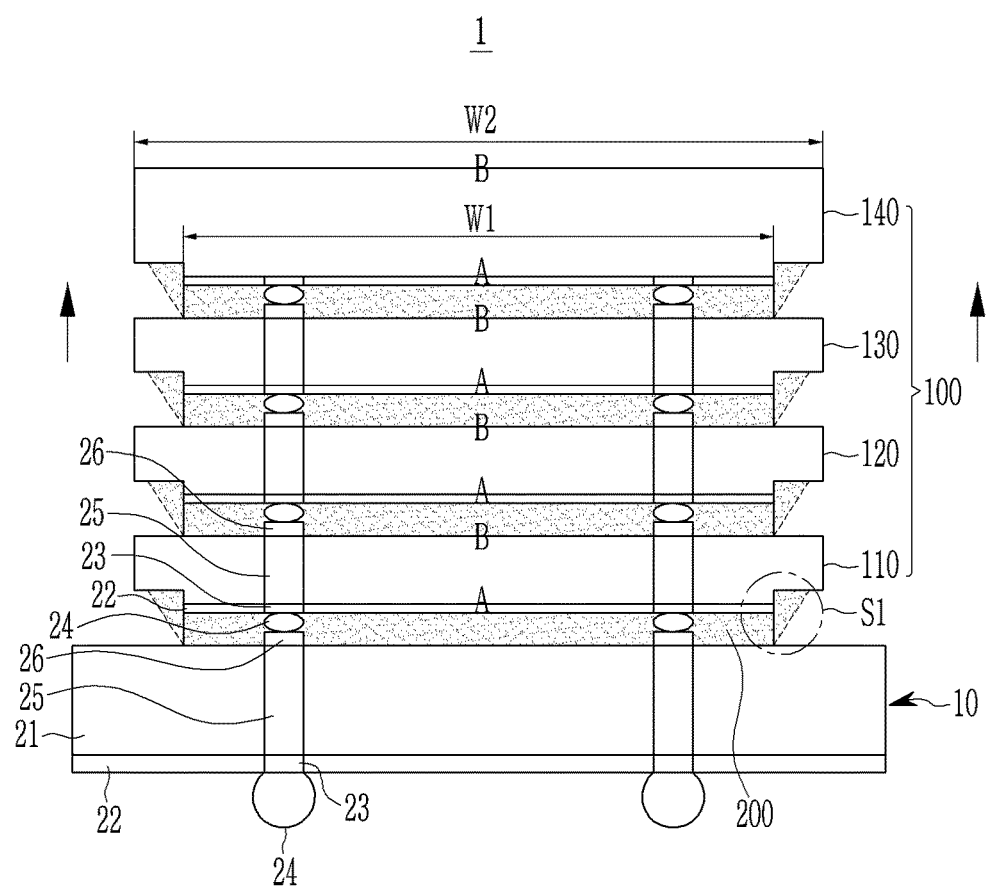
FIG. 1 is a schematic diagram of a 3D stacked semiconductor package according to an example embodiment.

FIG. 1 is a schematic configuration of a 3D stacked semiconductor package 1 according to an exemplary embodiment.

Referring to FIG. 1, the 3D stacked semiconductor package 1 (also referred to as the "semiconductor package") includes a substrate 10 and a 3D stacked semiconductor chip part 100 thereon.

The substrate 10 may include a body part 21, a passivation layer 22, a lower pad 23, a connection member 24, a through-silicon via (TSV) 25, and an upper pad 26. The substrate 10 may be formed based on an active wafer and an interposer substrate. Herein, the active wafer means a wafer on which a semiconductor chip may be formed like a silicon wafer.

When the substrate 10 is formed based on the active wafer, the body part 21 may include a semiconductor substrate, an integrated circuit layer, an interlayer insulating layer, and an intermetallic insulating layer. A plurality of wire layers may be formed in the intermetallic insulating layer. Herein, the semiconductor substrate may include an IV-group material wafer or III-V-group compound wafer like the silicon wafer. Further, the semiconductor substrate may be formed by a single crystal wafer like a silicon single crystal wafer in terms of a forming method. However, the semiconductor substrate is not limited to the single crystal wafer, and various wafers such as an epitaxial wafer, a polished wafer, an annealed wafer, and a silicon on insulator (SOI) wafer may be used as the semiconductor substrate. Herein, the epitaxial wafer means a wafer in which a crystal material is grown on a single crystal silicon substrate.

Even though the substrate 10 is formed based on the active wafer, the body part 21 includes only the semiconductor substrate and may not include the integrated circuit layer, the interlayer insulating layer, the intermetallic insulation layer, and the like.

When the substrate 10 is formed based on the interposer substrate, the body part 21 may be formed of silicon, glass, ceramic, plastic, or the like, as a part such as a simple support substrate.

The passivation layer 22 is formed on the bottom of the body part 21 and serves to protect the body part from the outside. The passivation layer 22 may be formed by an oxide film or a nitride film, or may be formed by a double layer of the oxide film and the nitride film. Further, the passivation layer 22 may be formed by the oxide film or the nitride film, for example, a silicon oxide film (SiO2) or a silicon nitride film (SiNx) by using a high-density plasma (HDP)-chemical vapor deposition (CVD) process.

The lower pad 23 is formed of a conductive material on the bottom of the body part 21 and may be electrically connected to the TSV 25 through the passivation layer 22. In FIG. 1, it is illustrated that the lower pad 23 is immediately connected with the TSV 25, but the lower pad 23 may be connected to the TSV 25 through a wire layer in the body part 21.

An under bump metal (UBM) may be formed on the lower pad 23. The lower pad 23 may be formed of aluminum (Al), copper (Cu), or the like and may be formed through a pulse plating or DC plating method. However, the lower pad 23 is not limited to the material or the method.

The connection member 24 may be formed on the lower pad 23. The connection member 24 may be formed of a conductive material, for example, copper (Cu), aluminum (Al), silver (Ag), tin, gold (Au), solder, or the like. However, the material of the connection member 24 is not limited thereto. The connection member 24 may be formed of a multilayer or a single layer. For example, in the case of being formed of the multilayer, the connection member 24 may include a copper pillar and solder, and in the case of being formed of the single layer, the connection member 24 may be formed of tin-silver solder or copper.

The TSV 25 may be connected to the lower pad 23 through the body part 21. In the example embodiment, of course, the TSV 25 may be formed by a Via-last, Via-first, or Via-middle structure.

For reference, the TSV may be divided into Via-last, Via-first, and Via-middle structures. The Via-first is called a structure with the TSV before the integrated circuit layer is formed, the Via-middle is called a structure with the TSV before a multilayered wire layer is formed after the integrated circuit layer is formed, and the Via-last is called a structure with the TSV after the multilayered wire layer is formed. In FIG. 1, it is illustrated that the TSV 25 is formed in the Via-last structure to be directly connected to the lower pad 23.

The TSV 25 may include at least one metal. For example, the TSV 25 may include a barrier metal layer and a wire metal layer. The barrier metal layer may include one or two or more stacking structures selected from titanium (Ti), tantalum (Ta), titanium nitride (TiN) and tantalum nitride (TaN). The wire metal layer may include one or more of aluminum (Al), gold (Au), beryllium (Be), bismuth (Bi), cobalt (Co), copper (Cu), hafnium (Hf), indium (In), manganese (Mn), molybdenum (Mo), nickel (Ni), lead (Pb), palladium (Pd), platinum (Pt), rhodium (Rh), rhenium (Re), ruthenium (Ru), tantalum (Ta), tellurium (Te), titanium (Ti), tungsten (W), zinc (Zn), and zirconium (Zr)

For example, the wire metal layer may include one or two or more stacked structures selected from tungsten (W), aluminum (Al) and copper (Cu). However, the material of the TSV 25 is not limited to the material.

A spacer insulating layer may be interposed between the TSV 25 and the body part 21. The spacer insulating layer may prevent the TSV 25 from directly contacting circuit elements in the body part 21. The spacer insulating layer may not be formed on the bottom of the TSV 25.

When the substrate 10 is formed based on the active wafer, the substrate 10 may function as a logic device and the 3D stacked semiconductor chip part 100 may include at least one semiconductor chip. For example, the at least one semiconductor chip may include a memory chip or a plurality of memory chips which are stacked. The memory chip(s) may include one or more of a dynamic random-access memory (DRAM), a static random-access memory (SRAM), a NAND flash memory, an electrically erasable programmable read-only memory (EEPROM), a parameter random-access memory (PRAM), a magnetoresistive random-access memory (MRAM), and a resistive random-access memory (RRAM). The 3D stacked semiconductor chip part 100 may further include at least one logic chip on which the memory chip or the plurality of memory chips which are stacked The 3D stacked semiconductor chip part 100 includes a first semiconductor chip 110, a second semiconductor chip 120, a third semiconductor chip 130, and a fourth semiconductor chip 140 that are sequentially stacked. However, this is just an example and embodiments may include a single semiconductor chip or a plurality of semiconductor chips. In addition, in the case of a single chip, the TSV and an upper pad may not be included in a semiconductor chip 140 of the top layer.

A passivation layer 22, a lower pad 23, a connection member 24, a TSV 25, an upper pad 26 and an underfill 200 may be provided for each of the first semiconductor chip 110, the second semiconductor chip 120, the third semiconductor chip 130, and the fourth semiconductor chip 140, similar to those provided for the substrate 10. These elements are the same as those described above and thus the detailed description thereof will be not be repeated.

Each of the first semiconductor chip 110, the second semiconductor chip 120, the third semiconductor chip 130, and the fourth semiconductor chip 140 include an inactive surface B, an active surface A, and a side surface between the inactive surface B and the active surface A. A first width W1 of the active surface is smaller than a second width W2 of the inactive surface. Each of the side surfaces of the first semiconductor chip 110, the second semiconductor chip 120, the third semiconductor chip 130, and the fourth semiconductor chip 140 include a side step S1 toward the inactive surface B from the active surface A. That is, the side surfaces of the first semiconductor chip 110, the second semiconductor chip 120, the third semiconductor chip 130, and the fourth semiconductor chip 140 include a stepped portion that extends from the active surface A. The side step S1 may have a planar surface that meet at right angle as shown in FIG. 1 or may have a curved (concave) shape that extends up and outward from the active surface A. The side step S1 may provide an overflow margin area of the underfill 200.

The first semiconductor chip 110 is bonded to the substrate 10 by an underfill 200. In particular, the underfill 200 is provided between the body part 21 of the substrate 10 and the passivation layer 22 on the active surface A of the first semiconductor chip 110. Similarly, the underfill 200 is provided between the second semiconductor chip 120 and the first semiconductor chip 110, between the third semiconductor chip 130 and the second semiconductor chip 120, and between the fourth semiconductor chip 140 and the third semiconductor chip 130.

The underfill 200 may be formed by an adhesive such as a non-conductive film (NCF), an anisotropic conductive film (ACF), a ultraviolet (UV) film, an instant adhesive, a thermosetting adhesive, a laser curing adhesive, an ultrasonic curing adhesive, and a non-conductive paste (NCP), general underfill resins, or the like.

Figure 2A:
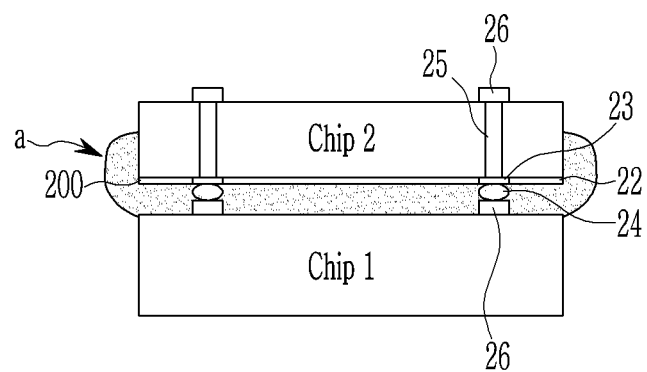
FIGS. 2A and 2B are schematic diagrams for describing an overflow phenomenon of an underfill.
Figure 2B:
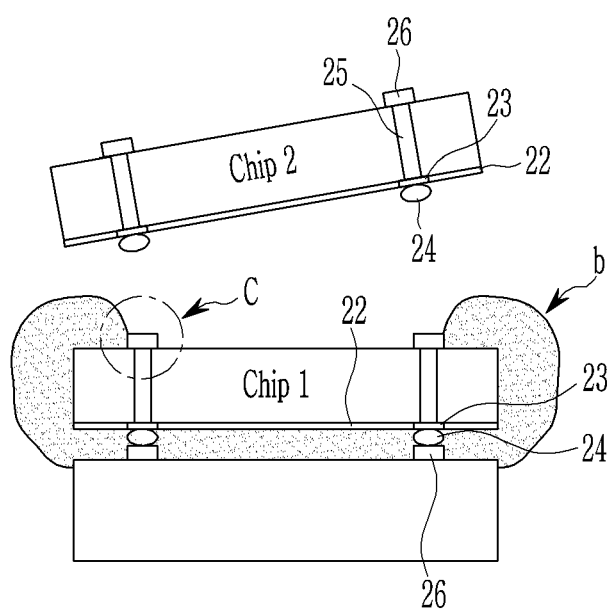

FIGS. 2A and 2B are schematic diagrams illustrating a phenomenon generated from the 3D stacked semiconductor package without the side step.

FIG. 2A illustrates a case where the underfill 200 is overflowed to the outside of the chip and FIG. 2B illustrates a case where the underfill 200 is overflowed to the outside and the top of the chip. As illustrated in FIG. 2A, when the underfill 200 is overflowed to the outside of the chip, there may be a problem in which the underfill 200 is connected between adjacent chips during chip to wafer bonding. As illustrated in FIG. 2B, when the underfill 200 is overflowed to the outside and the top of the chip, a balance of the upper chip is broken when the chips are stacked and thus a misalignment between the lower chip and the upper chip may be generated. Further, like a region C, the upper pad 26 may be contaminated. Further, a warpage phenomenon due to a difference in shrinkage between a large amount of the underfill 200 and the chip may easily occur.

Referring back to FIG. 1, in the 3D stacked semiconductor package 1 according to the example embodiment, because the steps S1 are provided at the sides of the first semiconductor chip 110, the second semiconductor chip 120, the third semiconductor chip 130, and the fourth semiconductor chip 140, even though the underfill 200 is partially overflowed by compressive force used when bonding through thermal compression, the underfill 200 is not overflowed past the side steps S1 to the outermost of the chip or not overflowed to the top of the chip due to a margin region provided by the side steps S1. The underfill 200 is extended to the side step S1 within the area represented by a dotted line by downward thermal compressive force provided during bonding and may be formed to be inclined or sloped in an upward direction (shown by an arrow) toward the inactive surface B from the active surface A.

Further, the underfill 200 is positioned at an inner side of the edges of the first semiconductor chip 110, the second semiconductor chip 120, the third semiconductor chip 130, and the fourth semiconductor chip 140 by removing the underfill 200 in an edge region of the first semiconductor chip 110, the second semiconductor chip 120, the third semiconductor chip 130, and the fourth semiconductor chip 140. Accordingly, since an entire volume of the underfill 200 in the semiconductor package of FIG. 1 is reduced compared to that of FIGS. 2A and 2B, a phenomenon in which the entire package is warped due to a difference in shrinkage between the chip and an underfill heterogeneous material may also be significantly improved. Such an effect may be further increased as the number of stacked semiconductor chips is increased.

Figure 3:
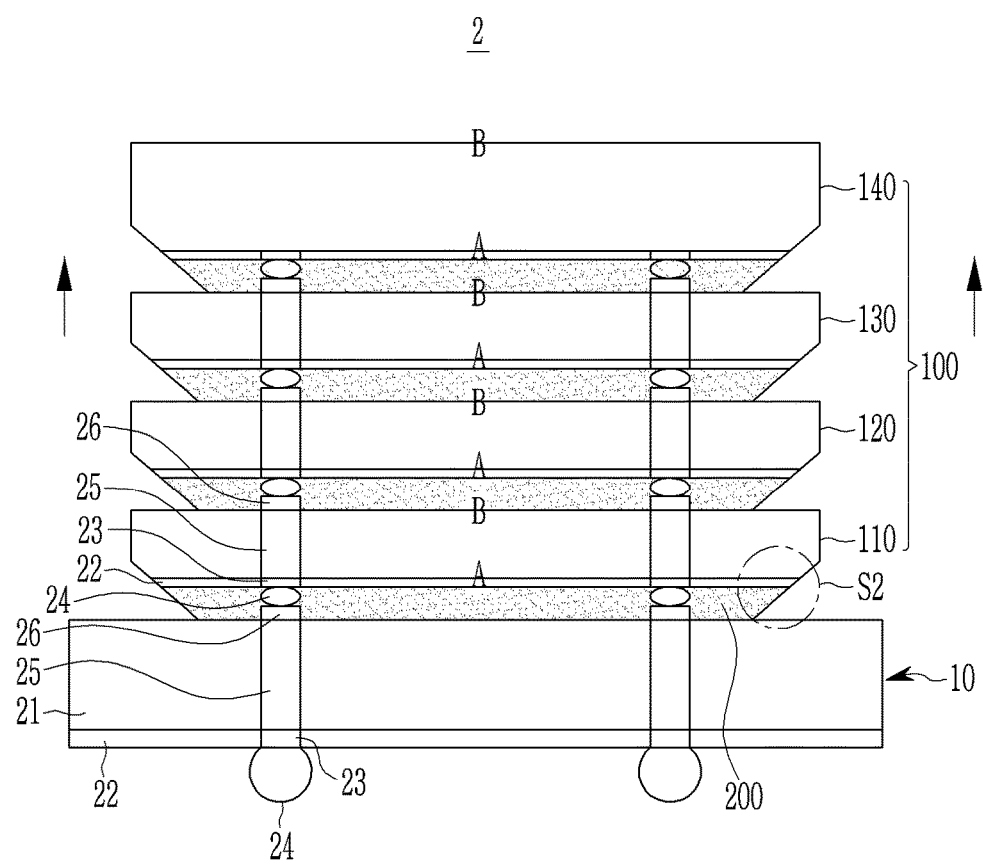
FIG. 3 is a schematic diagram of a 3D stacked semiconductor package according to another example embodiment.

FIG. 3 is a schematic diagram of a 3D stacked semiconductor package 2 according to another example embodiment.

Referring to FIG. 3, instead of the side step S1 provided in the first semiconductor chip 110, the second semiconductor chip 120, the third semiconductor chip 130, and the fourth semiconductor chip 140 illustrated in the semiconductor package of FIG. 1, a side slope (slope region) S2 toward the inactive surface B from the active surface A may be provided in the first semiconductor chip 110, the second semiconductor chip 120, the third semiconductor chip 130, and the fourth semiconductor chip 140. That is, a side of the first semiconductor chip 110 stacked on the substrate 10 includes a sloped portion that extends outwardly toward an inactive surface 114 from an active surface 112.

Similar to the side step S1 described with reference to FIG. 1, since the underfill 200 is prevented from being overflowed past the outermost side of the chip or to the top of the chip due to the side slope S2 and the underfill 200 is positioned at an inner side of the edges of the first semiconductor chip 110, the second semiconductor chip 120, the third semiconductor chip 130, and the fourth semiconductor chip 140, the entire volume of the underfill 200 is reduced to improve a warpage phenomenon.

Figure 4:
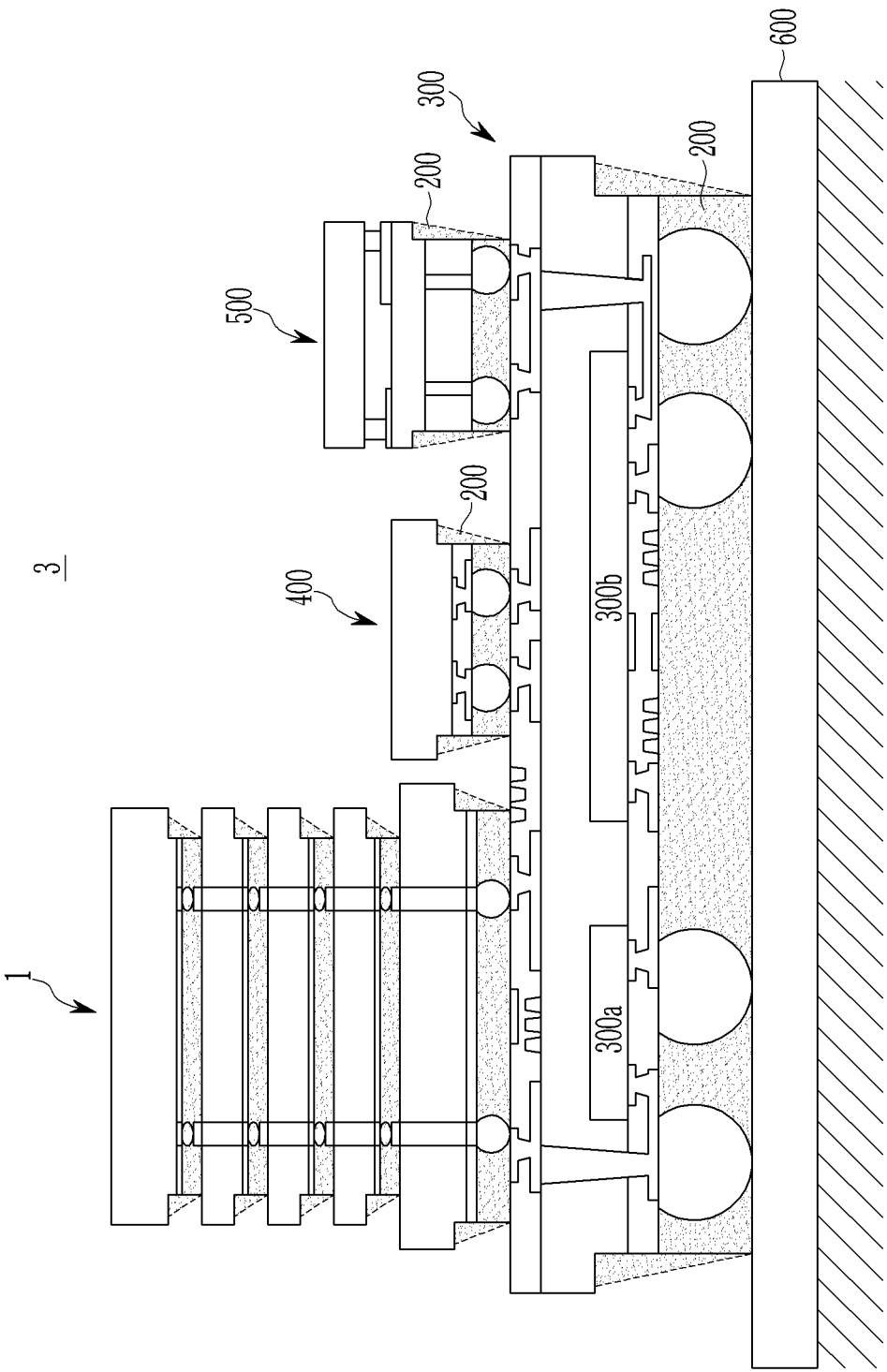
FIG. 4 is a schematic diagram of a 3D complex stacked semiconductor package according to yet another example embodiment.

FIG. 4 is a schematic diagram of a 3D stacked semiconductor package 3 according to yet another example embodiment.

Referring to FIG. 4, the 3D stacked semiconductor package 3 is a 3D complex stacked semiconductor package in which the 3D stacked semiconductor package 1 described with reference to FIG. 1, a flip-chip bonded semiconductor chip 400, and a 3D stacked wafer level package (WLP) 500 including a passive device, a microelectromechanical (MEMS) device, and the like are stacked on the substrate 300 by using a TSV 25.

The substrate 300 may be a fan-out WLP in which a plurality of logic chips, for example, a first logic chip 300a and a second logic chip 300b, are included in one package for high performance and downsizing of the 3D stacked semiconductor package 3 to form redistribution layers (RDLs) at the outside of the chip to be a system in package (SIP). In FIG. 4, it is illustrated that the substrate 300 is the fan-out WLP, but the substrate 300 may be a fan-in WLP. Further, the substrate 300 may be an interposer. The substrate 300 may be provided on a flexible printed circuit 600.

As described in FIGS. 1 and 3, in the 3D stacked semiconductor package 1 and the 3D stacked semiconductor package 2 in which the first semiconductor chip 110, the second semiconductor chip 120, the third semiconductor chip 130, and the fourth semiconductor chip 140 are 3D-stacked on the substrate 10, each of the first semiconductor chip 110, the second semiconductor chip 120, the third semiconductor chip 130, and the fourth semiconductor chip 140 has a side step S1 or a side slope S2.

In addition, a side step or a side slope may be formed on an active surface of the substrate 300, the flip-chip bonded semiconductor chip 400, and the 3D stacked WLP 500 to prevent the underfill 200 from being overflowed and improve a warpage phenomenon due to a difference in shrinkage between the heterogeneous materials.

Figure 5:
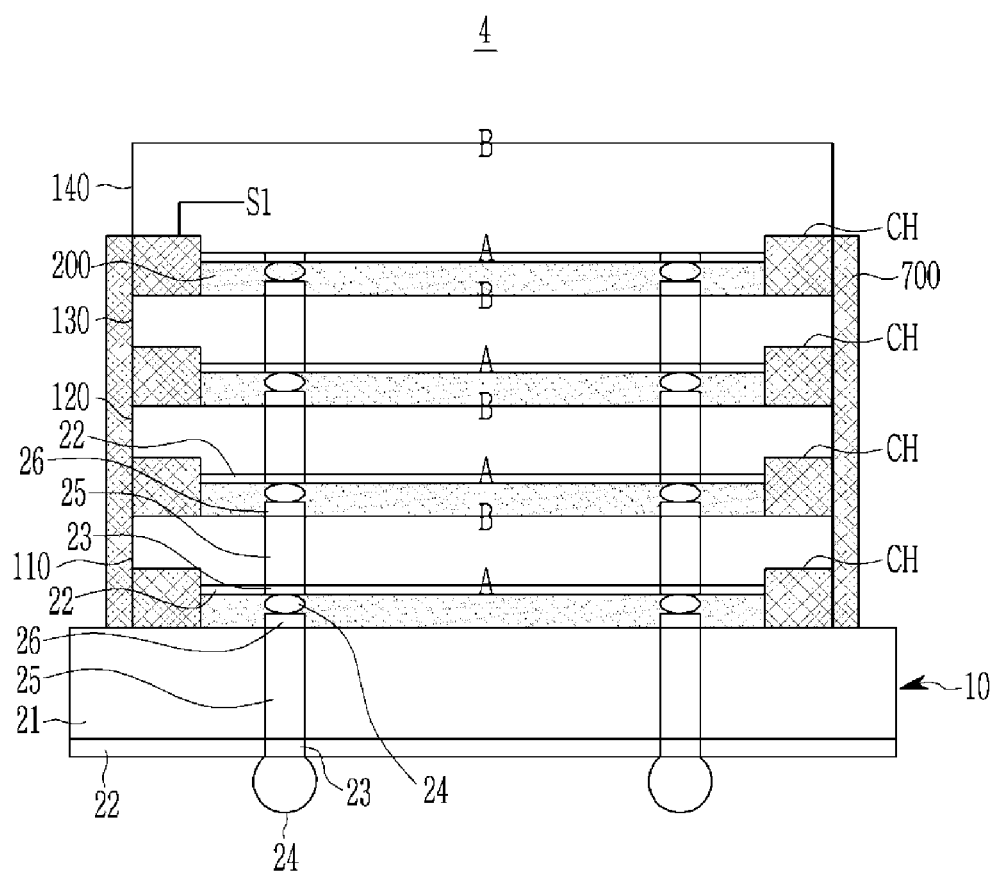
FIG. 5 is a schematic diagram of a 3D stacked semiconductor package including a cooling channel according to yet another example embodiment.

FIG. 5 is a schematic diagram of a 3D stacked semiconductor package 4 according to still another example embodiment.

A micro cooling channel 700 may be formed in a micro channel region CH formed by removing the underfill 200 from a side step S1 of the first semiconductor chip 110, the second semiconductor chip 120, the third semiconductor chip 130, and the fourth semiconductor chip 140 and edges of the first semiconductor chip 110, the second semiconductor chip 120, the third semiconductor chip 130, and the fourth semiconductor chip 140.

Since the first semiconductor chip 110, the second semiconductor chip 120, the third semiconductor chip 130, and the fourth semiconductor chip 140 are stacked, heat dissipation may be a very importance issue. Accordingly, the micro cooling channel 700 is formed by forming a heat transfer material film in the micro channel region CH or installing a cooling pipe capable of flowing water or an eco-friendly coolant in the micro channel region CH to efficiently emit heat generated in the first semiconductor chip 110, the second semiconductor chip 120, the third semiconductor chip 130, and the fourth semiconductor chip 140.

In FIG. 5, the micro cooling channel 700 is formed even at the sides of the first semiconductor chip 110, the second semiconductor chip 120, the third semiconductor chip 130, and the fourth semiconductor chip 140, but of course, may be formed only in the micro channel region CH.

Figure 6:
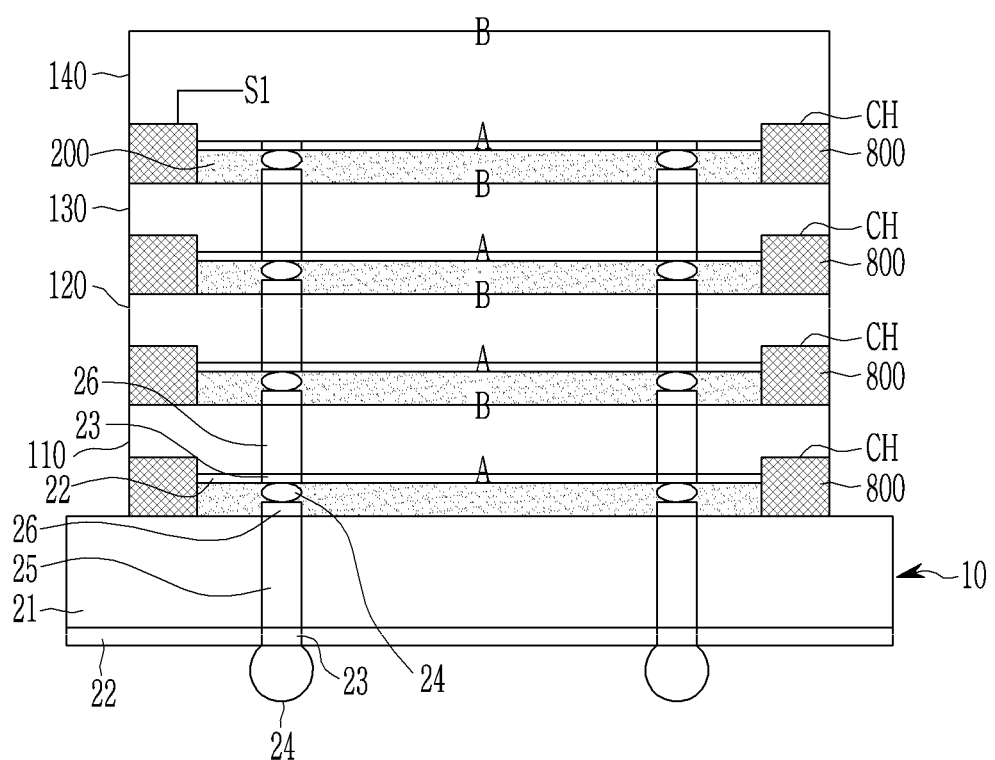
FIG. 6 is a schematic diagram of a 3D stacked semiconductor package including a passive device according to yet another example embodiment.

FIG. 6 is a schematic diagram of a 3D stacked semiconductor package 5 according to still yet another example embodiment.

A passive device 800 may be included in the micro channel region CH formed by removing the underfill 200 from the side step S1 of the first semiconductor chip 110, the second semiconductor chip 120, the third semiconductor chip 130, and the fourth semiconductor chip 140 and the edges of the first semiconductor chip 110, the second semiconductor chip 120, the third semiconductor chip 130, and the fourth semiconductor chip 140. The passive device 800 may be a device performing a function of increasing a signal processing speed of the first semiconductor chip 110, the second semiconductor chip 120, the third semiconductor chip 130, and the fourth semiconductor chip 140, filtering a signal, or the like. An example of the passive device 800 may be a capacitor, a resistor, an inductor, and the like. When the passive device 800 is disposed in the micro channel region CH, a connection wire for electric connection with these passive devices 800 is formed to be connected with the passive device 800 in the first semiconductor chip 110, the second semiconductor chip 120, the third semiconductor chip 130, and the fourth semiconductor chip 140.

FIGS. 7, 8, 9, 10 and 11 are schematic diagrams illustrating a fabrication process of the semiconductor package of FIG. 1.

Figure 7:
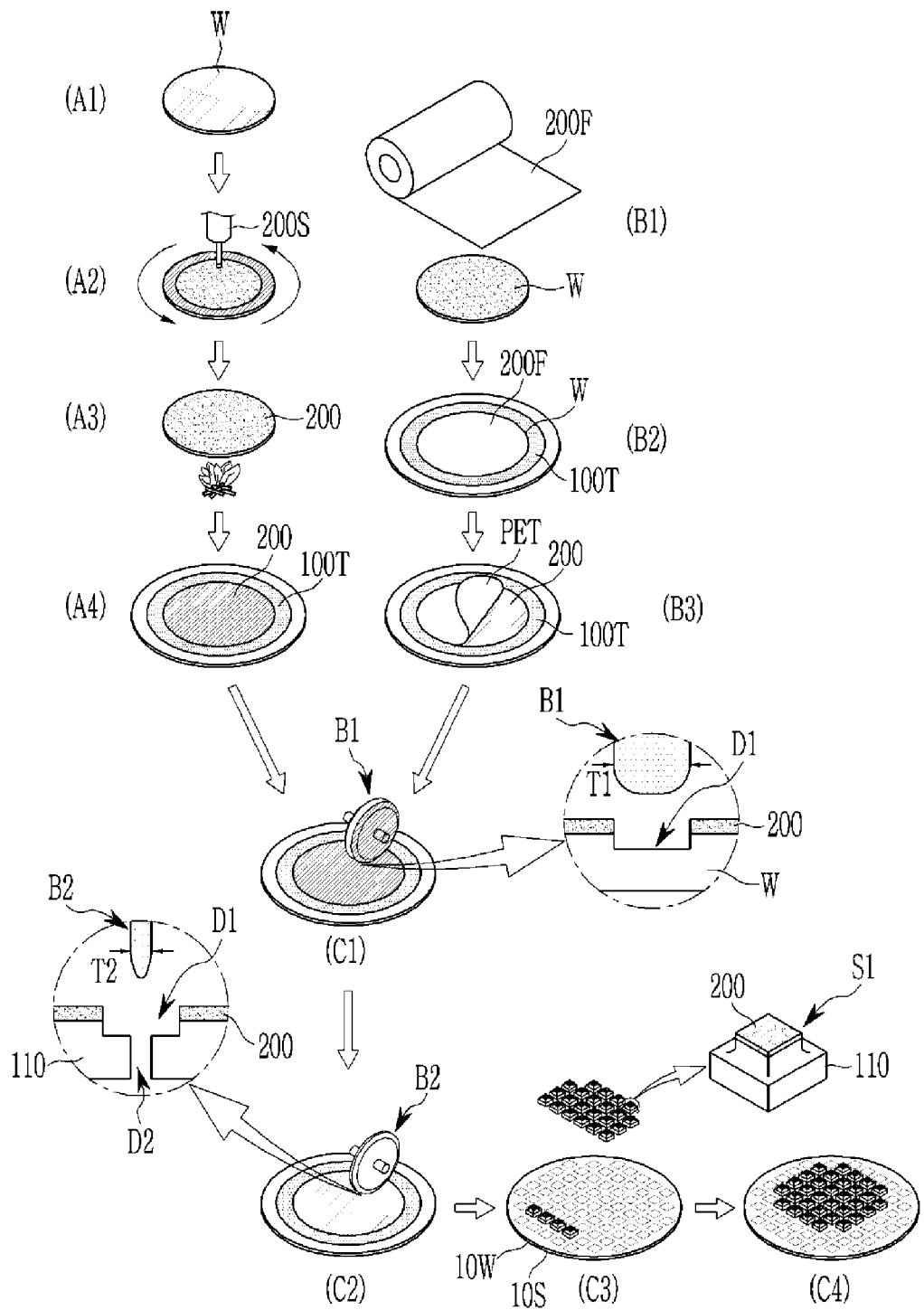
FIGS. 7, 8, 9, 10 and 11 are schematic diagrams illustrating a fabrication method of the semiconductor package illustrated in FIG. 1.

FIG. 7 is a schematic diagram for describing a process of forming a side step S1 in each chip 110, 120, 130, or 140 and mounting the side step S1 by a chip to wafer bonding method.

Referring to FIG. 7, the underfill 200 may be cured (A route) or provided (B route) as a film after being provided in a liquid.

When the underfill 200 is provided in the liquid, a wafer W in which the semiconductor device is manufactured is prepared (A1) and thereafter, a liquid underfill solution 200S is provided on the wafer W by a spin coating method (A2). Thereafter, the underfill 200 is completed by curing the liquid underfill by applying heat (A3) and the wafer W is attached to a dicing tape 100T (A4).

When the underfill 200 is provided as the film, an underfill film 200F is attached on an active surface of the wafer W (B1), the wafer W attached with the underfill film 200F is attached to the dicing tape 100T (B2), and thereafter, only the underfill 200 remains by removing a cover of the underfill film 200F on the an active surface of the wafer W (B3).

Subsequently, the wafer W with the underfill 200 is diced twice (C1 and C2). A first blade B1 used in the first dicing C1 primarily dices the partial region of the underfill 200 and the upper surface of the wafer W by applying the first blade B1 of which a diamond grit is large and rough or a thickness T1 is large. D1 refers to a part separated by primary dicing.

A second blade B2 used in the second dicing C2 completely dices a lower region of the wafer W by applying the second blade B2 of which a diamond grit is small and fine or a thickness T2 is small. D2 refers to a part separated by secondary dicing.

Subsequently, through two dicing steps (C1 and C2), the side step S1 is formed and the underfill 200 is partially removed from the edge of the chip. Then, a plurality of first semiconductor chips 110 with the underfill 200 on the active surfaces of the first semiconductor chips 110 is attached onto a carrier substrate 10S attached with a base wafer 10 W one by one by a chip-to-wafer bonding method (C3 and C4).

Alternatively, the side slope S2 illustrated in FIG. 3 may be formed by using a V-shaped blade as the first blade.

Further, in FIG. 7, it is described that the dicing is performed by using the blade, but the dicing may be performed by using a laser instead of the blade.

Figure 8:
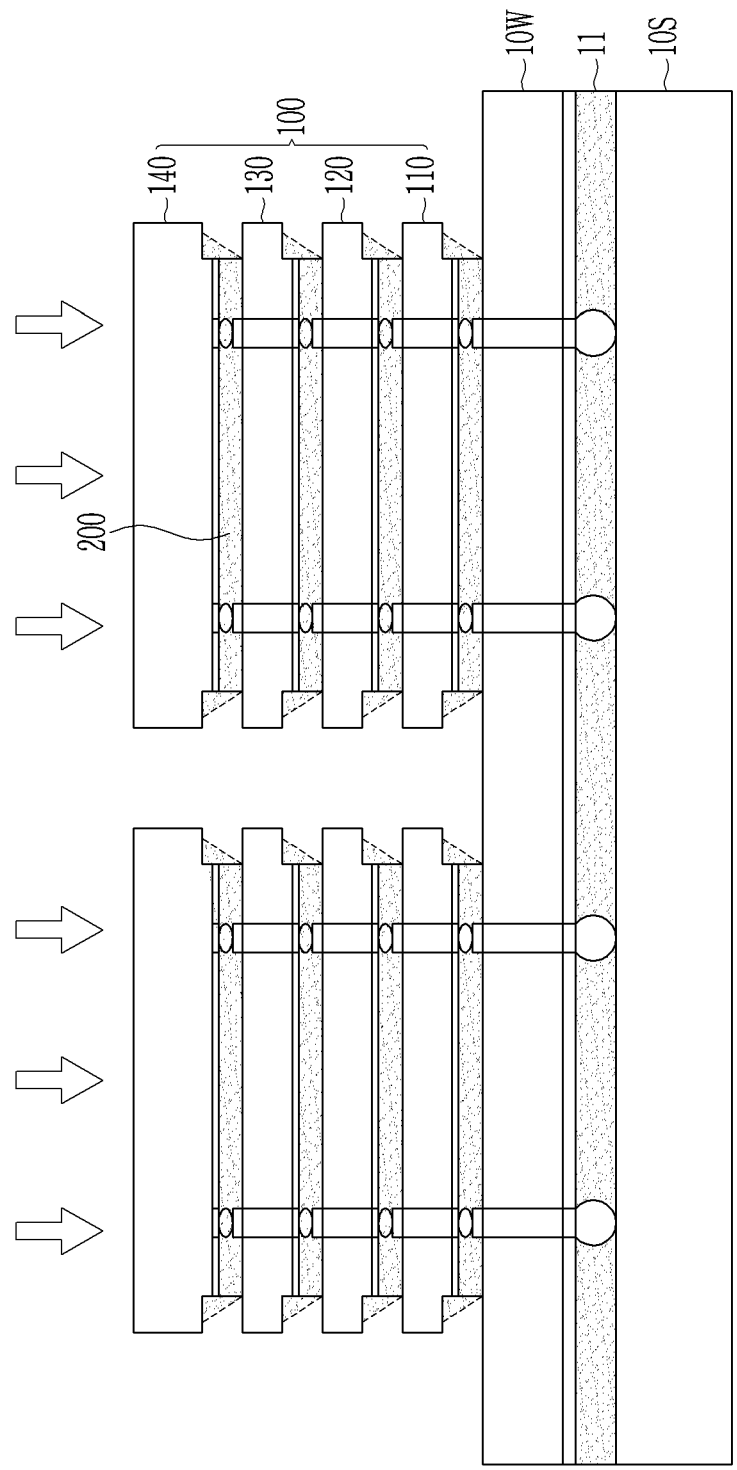

Referring to FIG. 8, the base wafer 10 W is attached onto the carrier substrate 10S by repetitively applying the step illustrated in FIG. 7 and the 3D stacked semiconductor chip part 100 stacked with the first semiconductor chip 110, the second semiconductor chip 120, the third semiconductor chip 130, and the fourth semiconductor chip 140 is formed thereon.

The base wafer 10 W with a plurality of TSVs 25 is prepared. The base wafer 10 W may be bonded and prepared on the carrier substrate 10S through an adhesive member 11. The carrier substrate 10S may be formed of silicon, germanium, silicon-germanium, gallium-arsenic (GaAs), glass, plastic, ceramic substrates, and the like. The adhesive member 11 may be formed of an NCF, an ACF, an instant adhesive, a thermosetting adhesive, a laser curing adhesive, an ultrasonic curing adhesive, an NCP, and the like.

The base wafer 10 W is a wafer formed with the plurality of TSVs 25 in a wafer level. The base wafer 10 W may be based on an active wafer and formed based on an interposer substrate. When the base wafer 10 W is based on the active wafer, the base wafer 10 W may include a plurality of semiconductor chips and the plurality of semiconductor chips may include the corresponding TSVs 25, respectively.

The 3D stacked semiconductor chip part 100 is formed by stacking the plurality of semiconductor chips (the first semiconductor chip 110, the second semiconductor chip 120, the third semiconductor chip 130, and the fourth semiconductor chip 140) on the base wafer 10 W. In FIG. 8, four semiconductor chips are exemplified, but the number of stacked semiconductor chips is not limited to four as described above. The semiconductor chips are sequentially stacked according to the step illustrated in FIG. 7. When the stacking is completed, the final bonding is performed through thermal compression (arrow).

In this case, even though the underfill 200 at the inner side is partially overflowed from the edge of the first semiconductor chip 110, the second semiconductor chip 120, the third semiconductor chip 130, and the fourth semiconductor chip 140, like the region illustrated by a dotted line, the underfill 200 is extended to the side step in an upward inclined direction, but is not overflowed to the outside or the top.

Figure 9:
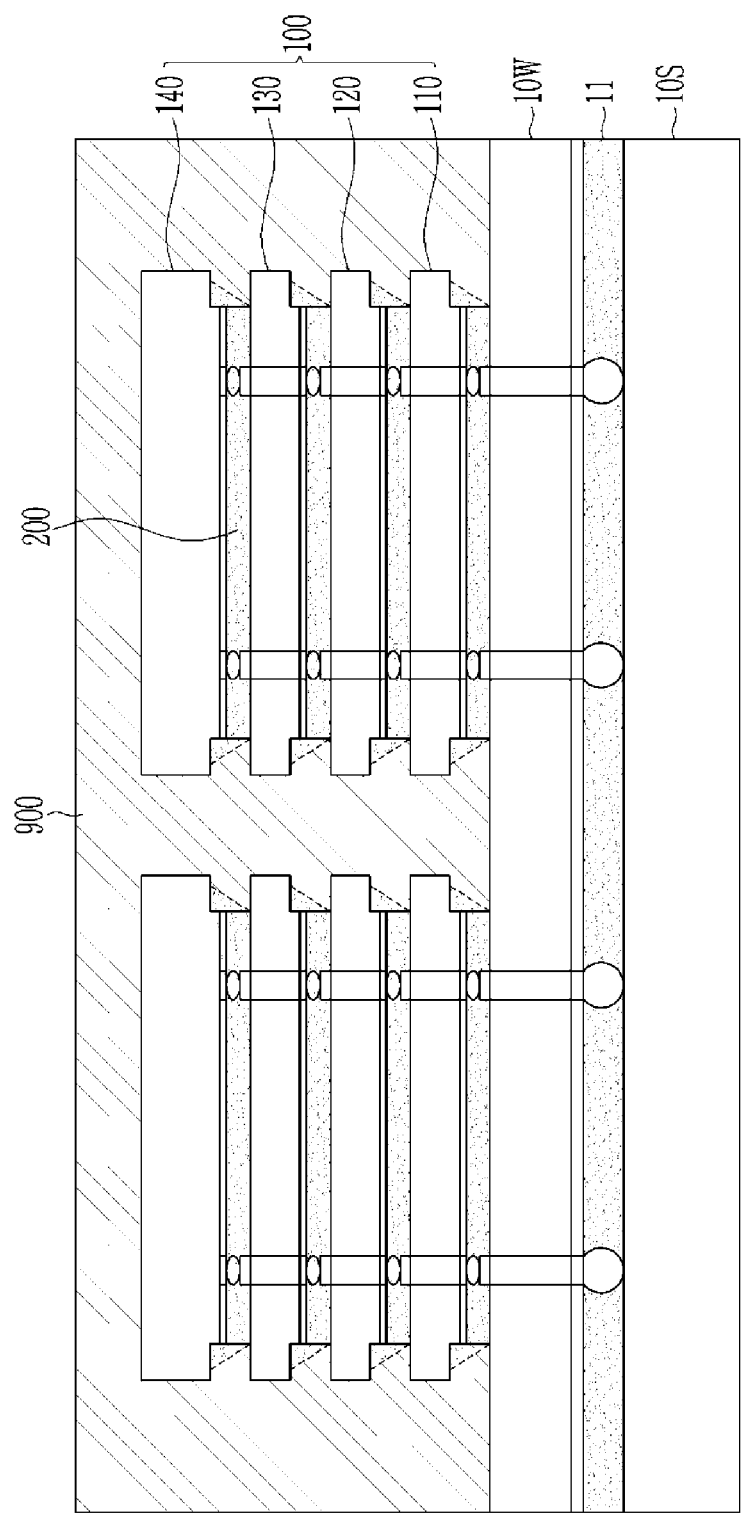

Referring to FIG. 9, the 3D stacked semiconductor chip part 100 is sealed by a sealant 900. The sealant 900 may be formed of a silicon-based material, a thermosetting material, a thermoplastic material, a UV-treated material, or the like. In the case of the thermosetting material, phenolic, acid anhydride, and amine-type curing agents and an additive acrylic polymer may be included. In the case of forming the sealant 900 by a resin, Young's modulus may be controlled by adjusting the content of the filler.

Figure 10:
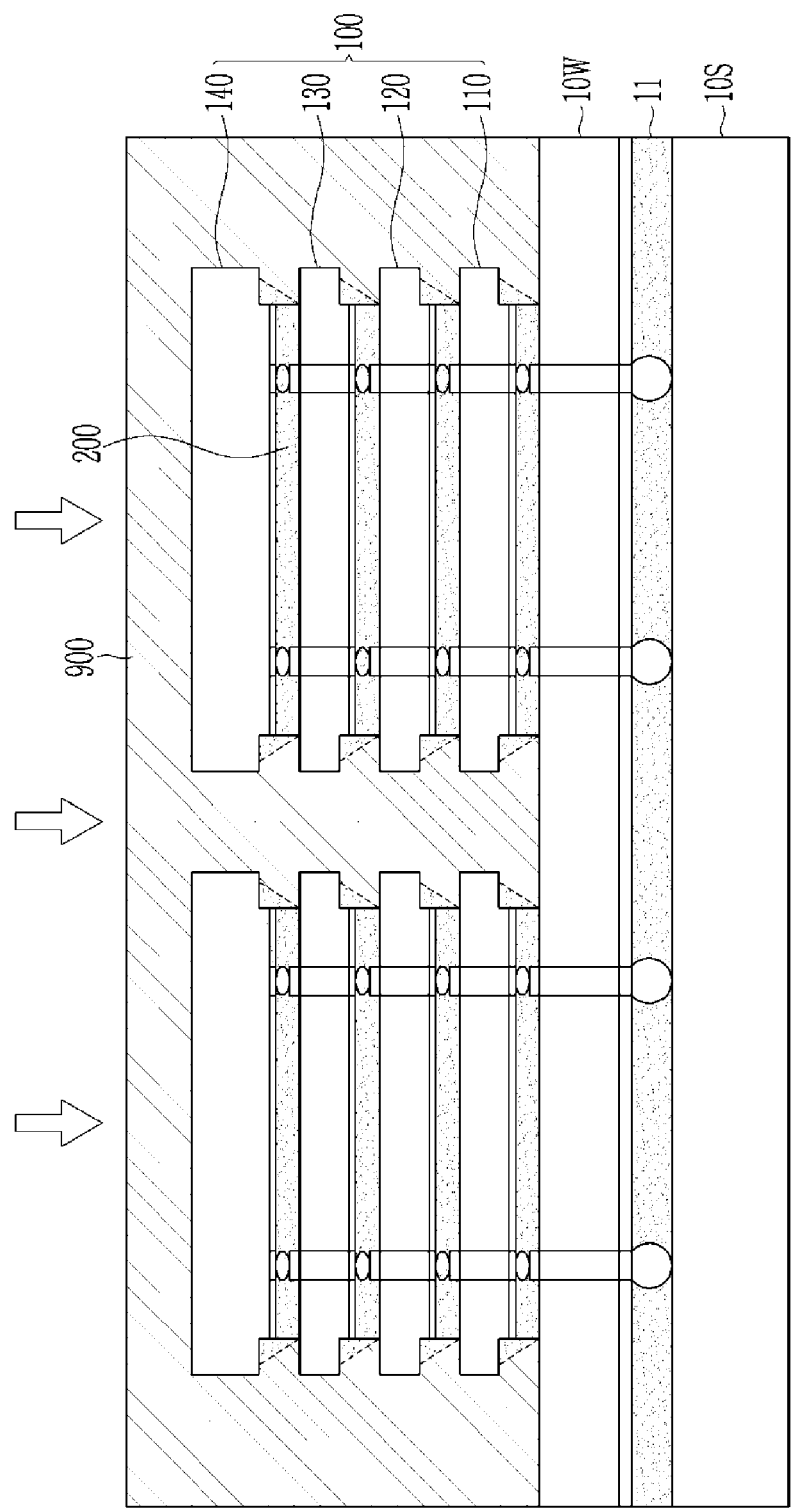

Referring to FIG. 10, the upper surface of the sealant 900 is ground to reduce a thickness of the sealant 900. In some cases, the grinding may be performed to expose the inactive surface of the top semiconductor chip 140 of the 3D stacked semiconductor chip part 100. A heat spreader may be mounted on the inactive surface of the semiconductor chip 140 exposed by grinding. The grinding process is performed for slimming the semiconductor package and may also be omitted in some cases.

Figure 11:
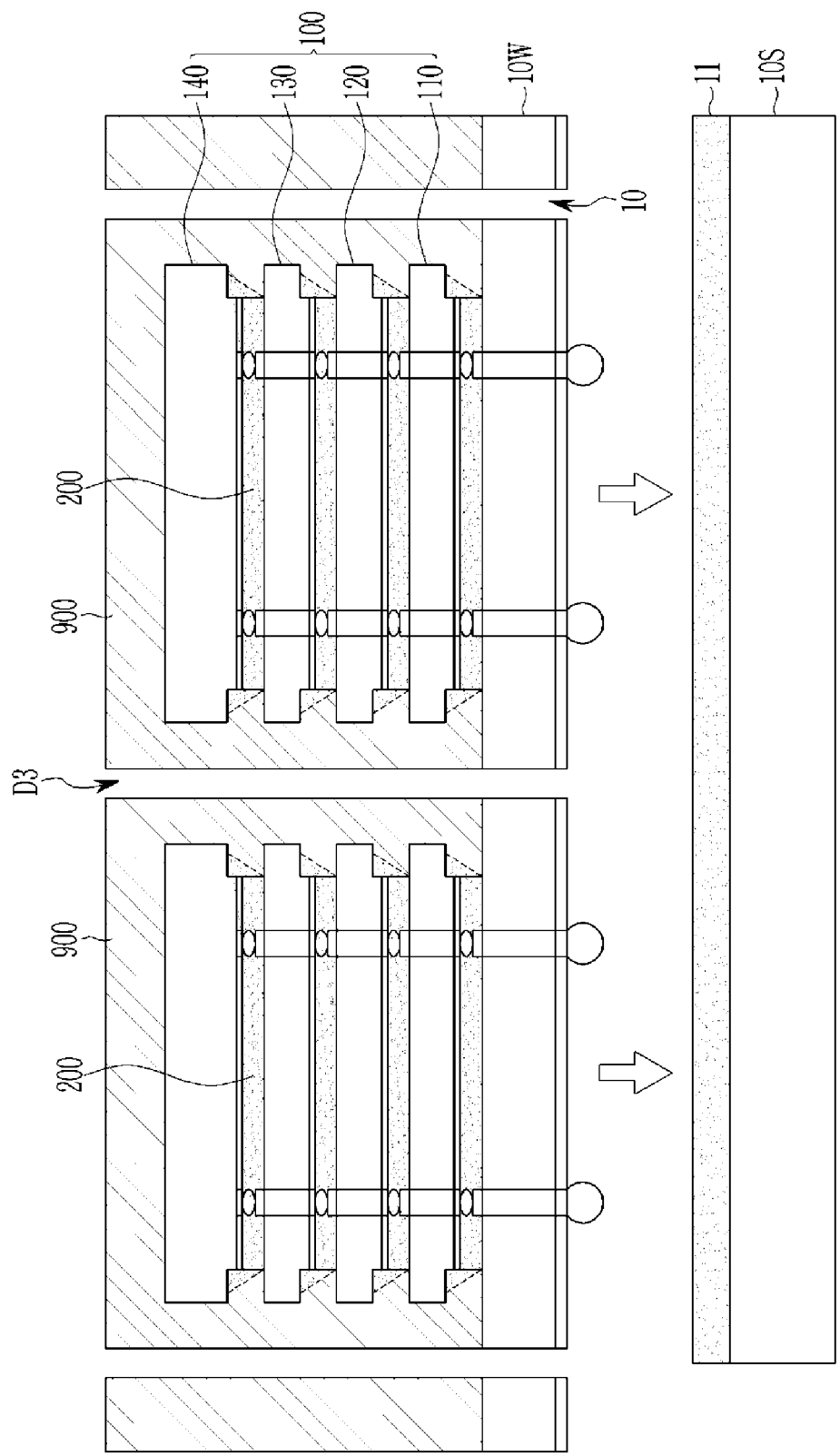

Referring to FIG. 11, each semiconductor package is separated through dicing as indicated by reference label D3. While the base wafer 10 W is bonded to the carrier substrate 10S, the base wafer 10 W is cut from the top of the sealant 900 to a predetermined part of the adhesive member 11 on the carrier substrate 10S through blade sowing or laser sowing, and then the semiconductor package may be detached from the carrier substrate 10S. The 3D stacked semiconductor chip part 100 corresponding to a defect is discarded later. A package electrical die sorting (EDS) test may be performed. The EDS may be performed before dicing. Only the packaged determined as good is separated and used through the EDS.

Figure 12:
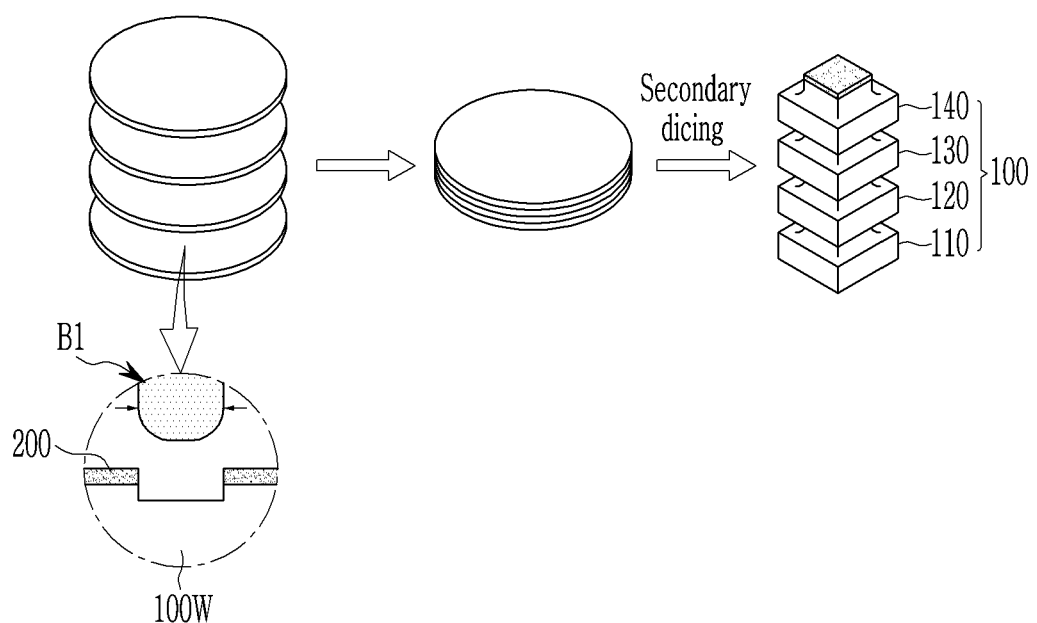
FIG. 12 is a schematic diagram illustrating another fabrication method of the semiconductor package illustrated in FIG. 1.

FIG. 12 is a schematic diagram illustrating that the semiconductor package 1 according to the example embodiments may be formed by a wafer-to-wafer bonding method.

Only the primary dicing is performed on the upper surface of each wafer W with the semiconductor device. Subsequently, all of the wafers W are integrally secondarily diced after wafer to wafer bonding to form the 3D stacked semiconductor chip part 100.

As discussed above, the semiconductor package according to one or more example embodiments can improve a warpage phenomenon.

Further, the semiconductor package according to one or more example embodiments can improve defects due to overflow of the adhesive.

While example embodiments have been described, it is to be understood that the inventive concept is not limited to the disclosed embodiments, but, on the contrary, is intended to cover various modifications and equivalent arrangements included within the spirit and scope of the appended claims.

What is claimed is:

1. A semiconductor package comprising:
   a substrate;
   a semiconductor chip disposed on the substrate, the semiconductor chip including a passivation layer, an active surface, an inactive surface and a side surface, wherein the passivation layer is disposed on the active surface, wherein the active surface is opposite to the inactive surface, wherein the active surface faces the substrate, wherein the side surface includes a side step or a side slope and is extended from an edge of the passivation layer to the inactive surface, and wherein a first width of the active surface is smaller than a second width of the inactive surface; and
   an underfill which is interposed between the substrate and the passivation layer of the semiconductor chip.

2. The semiconductor package of claim 1, wherein the underfill is extended to the side step or the side slope of the semiconductor chip.

3. The semiconductor package of claim 1, wherein the underfill is inclined in an upward direction toward the inactive surface from the active surface of the semiconductor chip.

4. The semiconductor package of claim 1, wherein the substrate is an interposer.

5. The semiconductor package of claim 1, further comprising a micro cooling channel provided at the side step or the side slope.

6. The semiconductor package of claim 1, further comprising a connection member disposed between the semiconductor chip and the substrate,
   wherein the underfill covers a lateral surface of the connection member.

7. The semiconductor package of claim 6, wherein the semiconductor chip further comprises a conductive pad on the active surface and is electrically connected to the connection member.

8. The semiconductor package of claim 1, wherein the active surface and the passivation layer have substantially the same widths.

9. The semiconductor package of claim 1, wherein the side step or the side slope of the side surface is extended from the edge of the passivation layer.

10. A semiconductor package comprising:
    a substrate;
    a plurality of semiconductor chips disposed on the substrate; and
    an underfill,
    wherein the plurality of semiconductor chips includes a first semiconductor chip and a second semiconductor chip on the first semiconductor chip,
    wherein the first semiconductor chip includes a first active surface, a first inactive surface and a first side surface,
    wherein the second semiconductor chip includes a second active surface, a second inactive surface and a second side surface,
    wherein the second active surface of the second semiconductor chip faces the first inactive surface of the first semiconductor chip,
    wherein the second side surface of the second semiconductor chip includes a side step or a side slope and is formed from the second active surface of the second semiconductor chip to the second inactive surface of the second semiconductor chip,
    wherein a first width of the second active surface of the second semiconductor chip is smaller than a second width of the second inactive surface of the second semiconductor chip, and
    wherein the underfill is disposed between the second active surface of the second semiconductor chip and the first inactive surface of the first semiconductor chip.

11. The semiconductor package of claim 10, wherein the underfill is extended to the side step or the side slope of the second side surface of the second semiconductor chip.

12. The semiconductor package of claim 11, wherein the underfill is inclined in an upward direction toward the second inactive surface from the second active surface of the second semiconductor chip.

13. The semiconductor package of claim 10, further comprising:
a through-silicon via provided in the first semiconductor chip; and
a connection member connected to the through-silicon via,
wherein the connection member is between the second active surface of the second semiconductor chip and the first inactive surface of the first semiconductor chip.

14. The semiconductor package of claim 13, wherein the first semiconductor chip further includes an upper pad between the connection member and the first inactive surface,
wherein the second semiconductor chip further includes a lower pad between the connection member and the second active surface, and
wherein the upper pad and the lower pad do not overlap the side step or the side slope of the second side surface of the second semiconductor chip.

15. The semiconductor package of claim 10, further comprising a micro cooling channel provided at the side step or the side slope.

16. The semiconductor package of claim 10, wherein the second semiconductor chip is bonded to the first semiconductor chip by the underfill, and
wherein the underfill is positioned at an inner side of an edge of the second semiconductor chip.

17. A semiconductor package comprising:
a substrate;
a semiconductor chip including an inactive surface, an active surface opposite to the inactive surface, and a side surface between the inactive surface and the active surface, the side surface including a stepped portion and extending from an edge of the active surface to an edge of the inactive surface; and
an underfill which is provided between the substrate and a passivation layer of the semiconductor chip,
wherein the stepped portion of the side surface includes a first lateral surface extending from the edge of the active surface and a second lateral surface extending from the edge of the inactive surface,
wherein at least a portion of the first lateral surface is substantially perpendicular to the active surface, and wherein at least a portion of the second lateral surface is substantially perpendicular to the inactive surface; and
wherein a first width of the active surface is smaller than a second width of the inactive surface.

18. The semiconductor package of claim 17, wherein the side surface includes the stepped portion, and the underfill extends to the stepped portion.

19. The semiconductor package of claim 17, wherein the passivation layer is disposed on the active surface, and
wherein the active surface and the passivation layer have substantially the same widths.

* * * * *